(12) United States Patent
Miller et al.

(10) Patent No.: US 11,394,159 B2
(45) Date of Patent: Jul. 19, 2022

(54) POSITIONING ADAPTER FOR COAXIAL CONNECTOR ASSEMBLY

(71) Applicant: TE Connectivity Services GmbH, Schaffhausen (CH)

(72) Inventors: Keith Edwin Miller, Manheim, PA (US); Francis John Blasick, Halifax, PA (US); Denver Harley Wilson, Palmyra, PA (US)

(73) Assignee: TE CONNECTIVITY SERVICES GmbH, Schaffhausen (CH)

( * ) Notice: Subject to any disclaimer, the term of this patent is extended or adjusted under 35 U.S.C. 154(b) by 19 days.

(21) Appl. No.: 17/012,246

(22) Filed: Sep. 4, 2020

(65) Prior Publication Data
US 2022/0077639 A1 Mar. 10, 2022

(51) Int. Cl.
*H01R 9/05* (2006.01)
*H01R 24/52* (2011.01)
*H01R 13/631* (2006.01)
*H01R 103/00* (2006.01)

(52) U.S. Cl.
CPC ....... *H01R 24/525* (2013.01); *H01R 13/6315* (2013.01); *H01R 2103/00* (2013.01)

(58) Field of Classification Search
CPC ............ H01R 2103/00; H01R 13/6315; H01R 13/5808; H01R 13/64; H01R 13/2421; H01R 23/7005; H01R 24/525
See application file for complete search history.

(56) References Cited

U.S. PATENT DOCUMENTS

| | | | |
|---|---|---|---|
| 3,366,920 A | 1/1968 | Laudig et al. | |
| 4,708,666 A | 11/1987 | Fisher, Jr. | |
| 5,934,945 A | 8/1999 | Petersen et al. | |
| 6,132,244 A * | 10/2000 | Leeman | H01R 24/50 439/541.5 |
| 7,014,503 B1 * | 3/2006 | Wang | H01R 25/006 439/581 |
| 7,077,697 B2 * | 7/2006 | Kooiman | H01R 9/0527 439/247 |

(Continued)

FOREIGN PATENT DOCUMENTS

WO 97/02629 1/1997

OTHER PUBLICATIONS

European Search Report, dated Feb. 2, 2022, EP 21 19 4320, European Application No. 21194320.4-1201.

*Primary Examiner* — Thanh Tam T Le (57) ABSTRACT

A coaxial connector assembly includes a connector module having a connector body that includes contact channels. The coaxial connector assembly includes coaxial contacts received in the corresponding contact channels having a center contact, a conductive shell coaxial with the center contact and an insulator between the center contact and the conductive shell. The coaxial connector assembly includes positioning adapters received in the corresponding contact channels having an adapter body forming an adapter bore that receives the coaxial contact. The adapter body engages the retention feature to position the coaxial contact relative to the adapter body and engages the connector body to position the coaxial contact in the contact cavity. The adapter component enables multiple coaxial contact sizes to be used in the same connector module contact channel.

20 Claims, 6 Drawing Sheets

(56) References Cited

U.S. PATENT DOCUMENTS

| | | | | |
|---|---|---|---|---|
| 7,186,138 | B2* | 3/2007 | Wang | H01R 13/73 |
| | | | | 439/541.5 |
| 7,607,929 | B1* | 10/2009 | Nguyen | H01R 13/6315 |
| | | | | 439/246 |
| 7,704,077 | B1* | 4/2010 | Morley | H01R 24/50 |
| | | | | 439/63 |
| 7,896,655 | B1* | 3/2011 | Blasick | H01R 24/50 |
| | | | | 439/63 |
| 7,922,529 | B1* | 4/2011 | Meurer | H01R 24/50 |
| | | | | 439/578 |
| 8,002,574 | B1* | 8/2011 | Yi | H01R 13/6315 |
| | | | | 439/455 |
| 8,123,556 | B2* | 2/2012 | Esplin | H01R 9/0515 |
| | | | | 439/579 |
| 8,282,415 | B1* | 10/2012 | Foltz | H01R 13/514 |
| | | | | 439/579 |
| 8,360,807 | B2* | 1/2013 | Buff | H01R 24/50 |
| | | | | 439/581 |
| 9,735,519 | B2 | 8/2017 | Yi et al. | |
| 10,490,941 | B2* | 11/2019 | Ruffini | H01R 13/502 |
| 10,498,061 | B1* | 12/2019 | Blasick | H01R 12/737 |
| 10,505,322 | B2 | 12/2019 | Miller | |
| 2014/0206221 | A1* | 7/2014 | Morley | H01R 9/05 |
| | | | | 439/370 |
| 2016/0134032 | A1 | 5/2016 | Hall et al. | |
| 2020/0169030 | A1 | 5/2020 | Ferderer et al. | |

* cited by examiner

POSITIONING ADAPTER FOR COAXIAL CONNECTOR ASSEMBLY

BACKGROUND

The subject matter described and/or illustrated herein relates generally to coaxial connector assemblies.

Coaxial connectors are known for interconnecting various coaxial components, such as coaxial cables, circuit boards, and/or the like. Coaxial connectors include one or more coaxial contact pairs. Each coaxial contact pair includes a center contact and a conductive shell that is arranged coaxially with the center contact. Coaxial connectors often include an array of coaxial contacts. The coaxial connectors may be designed to receive first types of coaxial contacts, such as coaxial contacts having a first diameter. Other coaxial connectors may be designed to receive second types of coaxial contacts, such as coaxial contacts having a second diameter. It may be desirable to utilize different types of coaxial contacts in the same coaxial connector. However, redesign of the coaxial connectors to arrange the different diameter coaxial contacts in the connector body is costly.

There is a need for a coaxial connector assembly configured to receive different diameter coaxial contacts.

BRIEF DESCRIPTION

In an embodiment, a coaxial connector assembly is provided. The coaxial connector assembly includes a connector module having a connector body that includes contact channels extending therethrough between a front side and a rear side of the connector body. The front side faces in a mating direction for mating with a mating connector assembly. The coaxial connector assembly includes coaxial contacts received in the corresponding contact channels. The coaxial contacts are terminated to ends of coaxial cables. Each coaxial contact has a center contact, a conductive shell coaxial with the center contact, and an insulator between the center contact and the conductive shell. The conductive shell has a retention feature. The coaxial connector assembly includes positioning adapters received in the corresponding contact channels. Each positioning adapter includes an adapter body forming an adapter bore extending between a front and a rear of the positioning adapter. The adapter bore receives the corresponding coaxial contact such that the adapter body surrounds the coaxial contact. The adapter body engages the retention feature to position the coaxial contact relative to the adapter body. The adapter body engages the connector body to position the coaxial contact in the contact cavity relative to the connector body.

In another embodiment, a coaxial connector assembly is provided. The coaxial connector assembly includes a connector module having a connector body that includes first contact channels and second contact channels extending therethrough between a front side and a rear side of the connector body. The front side faces in a mating direction for mating with a mating connector assembly. The coaxial connector assembly includes first coaxial contacts received in the corresponding first contact channels. The first coaxial contacts are terminated to ends of first coaxial cables. Each first coaxial contact has a first center contact, a first conductive shell coaxial with the first center contact, and a first insulator between the first center contact and the first conductive shell. The first conductive shell has a retention feature. The coaxial connector assembly includes second coaxial contacts received in the corresponding second contact channels. The second coaxial contacts are terminated to ends of second coaxial cables. Each second coaxial contact has a second center contact, a second conductive shell coaxial with the second center contact, and a second insulator between the second center contact and the second conductive shell. The coaxial connector assembly includes positioning adapters coupled to the corresponding first coaxial contacts. The positioning adapters are received in the corresponding first contact channels. Each positioning adapter includes an adapter body forming an adapter bore extending between a front and a rear of the positioning adapter. The adapter bore receives the corresponding first coaxial contact such that the adapter body surrounds the first coaxial contact. The adapter body engages the retention feature to position the coaxial contact relative to the adapter body. The adapter body engages the connector body to position the coaxial contact in the contact cavity relative to the connector body. The first contact channels have equivalent dimensions as the second contact channels. The adapter bodies have substantially similar diameters as the second conductive shells.

In another embodiment, a coaxial contact assembly is provided. The coaxial contact assembly includes a center contact having a mating end and a cable end. The cable end is configured to be terminated to a conductor of a coaxial cable. The coaxial contact assembly includes a conductive shell coaxial with the center contact. The conductive shell has a mating end and a cable end. The cable end is configured to be terminated to a cable shield of the coaxial cable. The conductive shell includes a shell bore receiving the center contact. The conductive shell has a retention feature. The coaxial contact assembly includes an insulator received in the shell bore between the center contact and the conductive shell. The coaxial contact assembly includes a positioning adapter configured to be received in a contact cavity of a connector module. The positioning adapter includes an adapter body forming an adapter bore extending between a front and a rear of the positioning adapter. The adapter bore receives the conductive shell such that the adapter body surrounds an exterior of the conductive shell. The adapter body engages the retention feature to position the conductive shell relative to the adapter body and position the conductive shell in the contact cavity.

DETAILED DESCRIPTION

Embodiments set forth herein include coaxial connector assemblies and communication systems that include such coaxial connector assemblies. The communication system may include, for example, a circuit board that is secured to the coaxial connector assembly. In some embodiments, the communication system is a backplane (or midplane) communication system. As used herein, the terms backplane and midplane are used interchangeably and represent a system interface for multiple daughter card assemblies (e.g., line cards or switch cards). In other embodiments, the communication system is a circuit board assembly (e.g., daughter card assembly). One or more embodiments permit utilization of different sized coaxial contacts within the coaxial connector assembly. One or more embodiments permit two different sized coaxial contacts to be loaded into the same diameter contact channels in the coaxial connector assembly. One or more embodiments permit a connector module of the connector assembly to float during a mating operation. One or more embodiments enable using a denser grouping of coaxial contacts by permitting the coaxial contacts to be rear-loaded into the connector module. In particular embodiments, the connector module is permitted to float and also enables rear-loading of coaxial contacts.

As used herein, phrases such as "a plurality of [elements]," "a set of [elements]," "an array of [elements]," and the like, when used in the detailed description and claims, do not necessarily include each and every element that a component may have. For instance, the phrase "the connector module having a plurality of coaxial contacts that include [a recited feature]" does not necessarily mean that each and every coaxial contact of the connector module has the recited feature. Instead, only some of the coaxial contacts may have the recited feature and other coaxial contacts of the connector module may not include the recited feature. As another example, the detailed description or the claims may recite that a connector assembly includes "cable assemblies, each of which including a [recited feature]." This phrase does not exclude the possibility that other cable assemblies of the connector assembly may not have the recited feature. Accordingly, unless explicitly stated otherwise (e.g., "each and every cable assembly of the connector module"), embodiments may include similar elements that do not have the same features.

Figure 1:
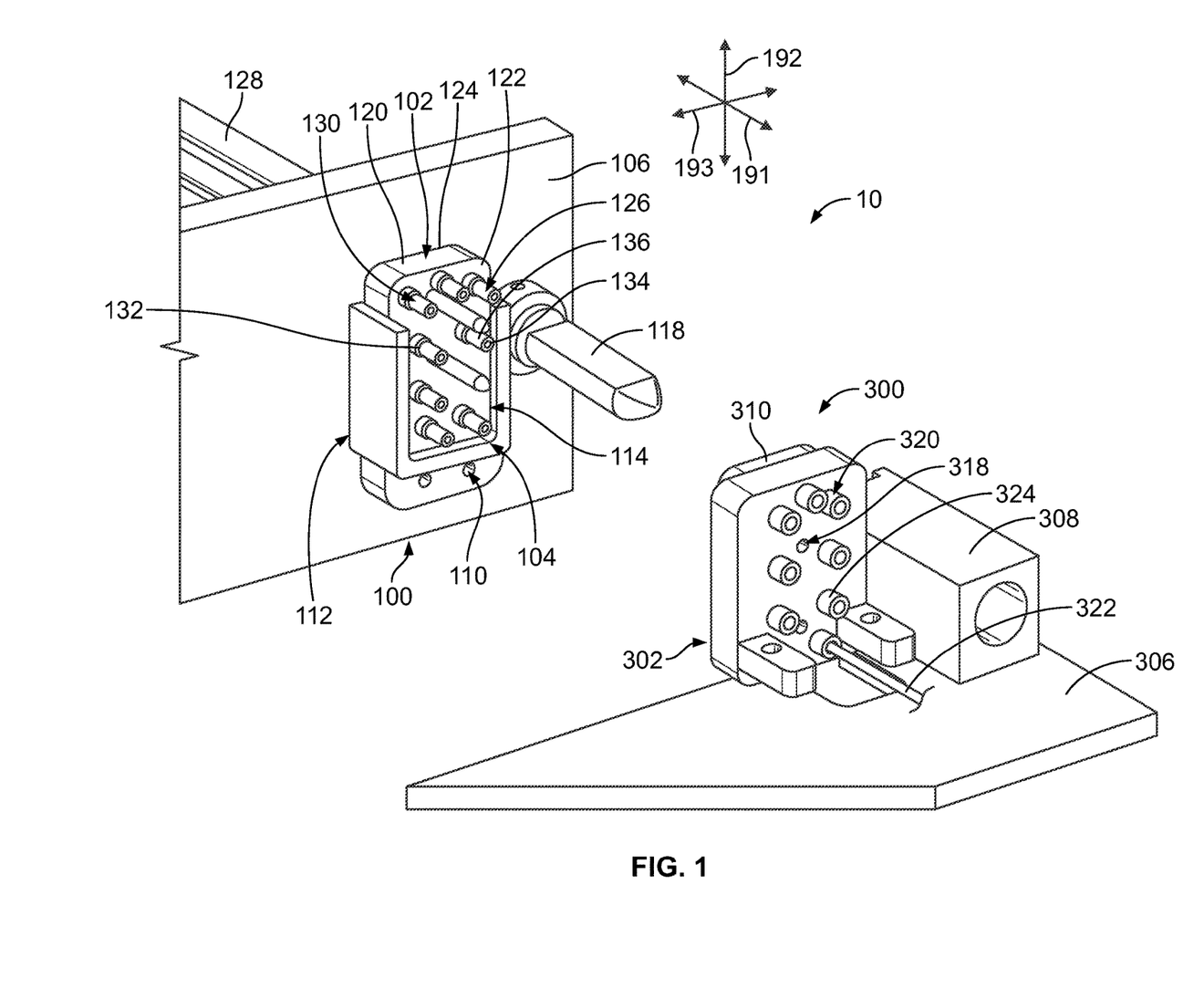
FIG. 1 illustrates a communication system in accordance with an exemplary embodiment, showing a connector assembly and a mating connector assembly in an unmated state.
Figure 2:
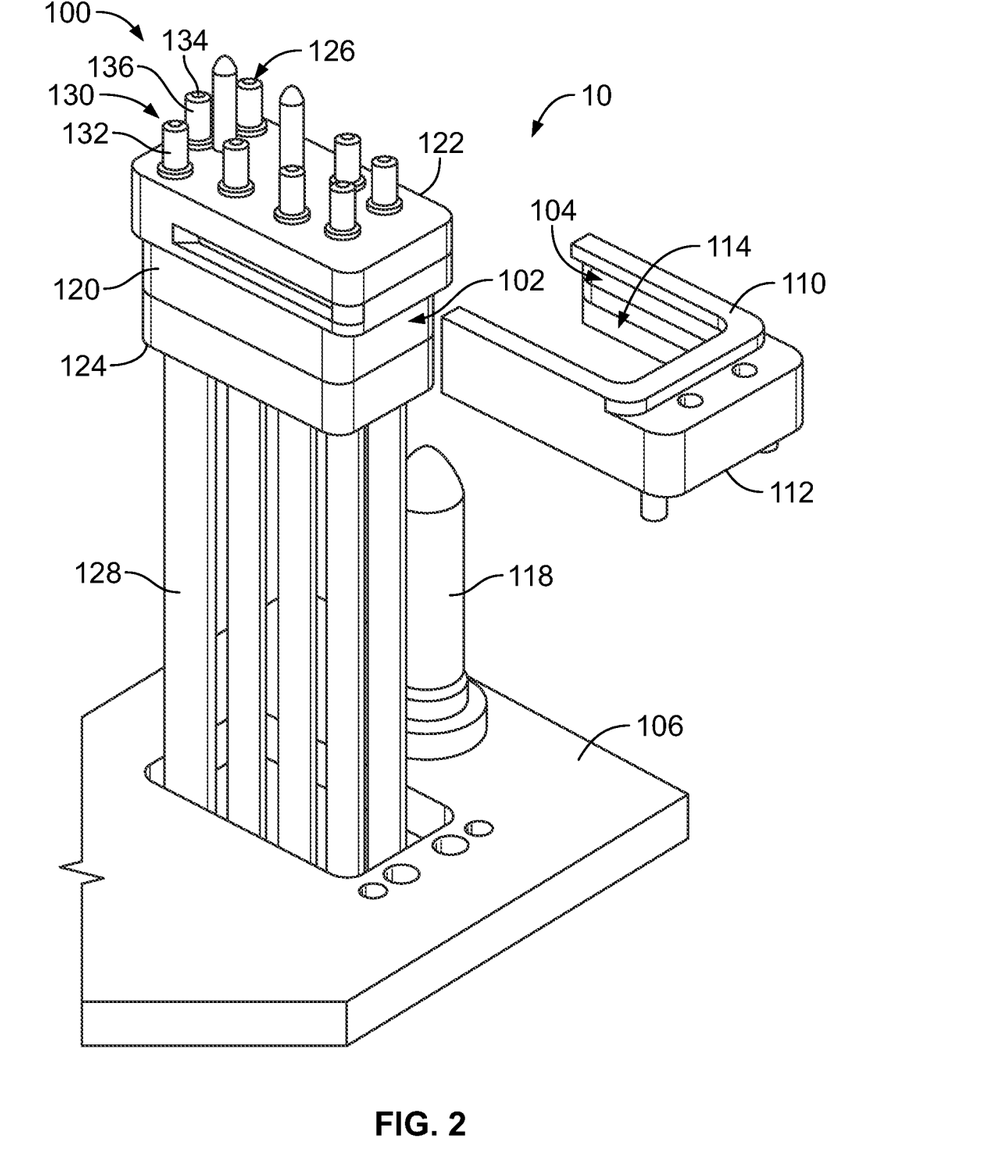
FIG. 2 is an exploded view of a portion of the communication system showing the connector assembly in accordance with an exemplary embodiment.

FIG. 1 illustrates a communication system 10 in accordance with an exemplary embodiment, showing a connector assembly 100 and a mating connector assembly 300 in an unmated state. FIG. 2 is an exploded view of a portion of the communication system showing the connector assembly 100 in accordance with an exemplary embodiment. In the illustrated embodiment, the connector assemblies 100, 300 are coaxial connector assemblies and may be referred to hereinafter as coaxial connector assemblies 100, 300. However, the communication system 10 may be provided with other types of connector assemblies, such as pin and socket connector assemblies, fiber optic connector assemblies, and the like. The connector assemblies 100, 300 are configured to be mated along a mating axis 191. For reference, the connector assemblies 100, 300 are oriented with respect to mutually perpendicular axes 191-193, which includes the mating axis 191, a first lateral axis 192, and a second lateral axis 193.

In some applications, the connector assemblies 100, 300 may be referred to more generally as a circuit board assemblies. The communication system 10 may be configured for radiofrequency (RF) applications. In particular embodiments, the communication system 10 and/or its components, such as the connector assembly 100 and/or 300, are configured to satisfy military and aerospace applications. For example, the components of the communication system 10 may be configured to satisfy one or more industry or government standards, such as MIL-STD-348. To illustrate one example of the communication system 10, the connector assemblies 100, 300 may form an interconnect between analog and digital sections of a radio. The connector assembly 300 may perform analog functions. The connector assembly 300 may be replaced with other connector assemblies that are configured to perform the same or different operations. The digital functions, including digital signal processing, may be performed by a communication component (not shown) that is coupled to the connector assembly 100. The other communication component may be another daughter card assembly (not shown).

The communication system 10 and/or its components (e.g., the connector assembly 100 and/or 300) may be configured to satisfy one or more industry or government standards. By way of example only, embodiments may be configured to satisfy the VME International Trade Association (VITA) standards (e.g., VITA 48, VITA 67, et al.). The communication system 10 and/or its components may have an operating speed that achieves 50 GHz or greater. In particular embodiments, the communication system 10 and/or its components may achieve an operating speed of 60 GHz or greater. It should be understood, however, that other embodiments may be configured for different standards and may be configured to operate at different speeds. In some configurations, embodiments may be configured to operate within the range of DC to 60.0 GHz.

In an exemplary embodiment, the connector assembly 300 is a daughter card assembly having a connector module 302. In various embodiments, the connector module 302 may be mounted to a substrate 306, which may be a circuit card, such as a daughter card. The connector assembly 300 includes a guide module 308 mounted to the substrate 306 proximate to the connector module 302. The guide module 308 is used to guide mating with the connector assembly 100. In the illustrated embodiment, the guide module 308 includes an opening configured to receive an alignment pin. The opening may be chamfered or have a lead-in. Other types of guide features may be used in alternative embodiments, such as a guide post. In the illustrated embodiment, the connector module 302 is a right-angle connector module having the substrate 306 oriented perpendicular to the mating face of the connector module 302. The substrate 306 is oriented perpendicular to the substrate of the connector assembly 100. However, other orientations are possible in alternative embodiments. For example, the connector module 302 may be a mezzanine connector having the substrate 306 oriented parallel to the mating face and parallel to the substrate of the connector assembly 100.

The connector module 302 includes a connector body 310 holding cable assemblies 320. Each cable assembly 320 includes a cable 322 and a contact 324 terminated to the end of the cable 322, and may be routed to a remote location. Alternatively, the cables 322 may be terminated to the substrate 306, such as via substrate contacts. In other alternative embodiments, the contacts 324 may be terminated to the substrate 306 rather than having cables 322. The connector body 310 includes a plurality of contact channels (not shown) receiving corresponding cable assemblies 320. The connector body 310 includes alignment features 318 for aligning the connector module 302 with the connector assembly 100 during mating. In the illustrated embodiment, the alignment features 318 are openings. Other types of alignment features may be provided in alternative embodiments. The alignment features 318 may be arranged to provide keyed mating with the connector assembly 100.

In various embodiments, the contact 324 is a coaxial contact; however, other types of contacts may be provided in alternative embodiments, such as pin contacts, socket contacts, fiber optic contacts (for example, fiber optic ferrules), and the like. In an exemplary embodiment, the coaxial contact 324 is an RF contact. The coaxial contact 324 includes an inner contact and an outer contact surrounding the inner contact. The inner contact is configured to be terminated to a conductor of the cable. The outer contact is configured to be terminated to a shield, such as a cable braid, of the cable 322. Other arrangements are possible in alternative embodiments.

The connector assembly 100 includes a connector module 102 holding coaxial cable assemblies 126 configured to be mated with the cable assemblies 320 of the connector assembly 300. In an exemplary embodiment, the connector assembly 100 includes a mounting frame 104 used to mount the connector module 102 to a substrate, such as a support wall 106. The support wall 106 may be, for example, a circuit board, panel, or other type of wall. In various embodiments, the connector module 102 is floatably held between the mounting frame 104 and the support wall 106 to allow movement and/or alignment of the coaxial cable assemblies. For example, the connector module 102 is permitted to move in a lateral direction during a mating operation.

The mounting frame 104 includes opposite mating and mounting sides 110, 112. The mounting side 112 is configured to be mounted to the support wall 106. The mounting frame 104 includes a passage 114 that extends through the mating and mounting sides 110, 112. The passage 114 is sized and shaped to receive a portion of the connector module 102. The connector module 102 includes alignment posts 118 extending forward therefrom to engage the mating connector assembly 300 (FIG. 1) during the mating operation. The alignment posts 118 may be received in the alignment openings 318. In the illustrated embodiment, the connector assembly 100 includes two alignment posts 118. In other embodiments, however, the connector assembly 100 may include only one alignment post 118 or more than two alignment posts 118.

The connector module 102 includes a connector body 120 having a front side 122 and a rear side 124. The coaxial cable assemblies 126 are coupled to the connector body 120. The coaxial cable assemblies 126 may extend from the front side 122. The coaxial cable assemblies 126 may extend from the rear side 124. In an exemplary embodiment, the coaxial cable assemblies 126 include cables 128 extending from the rear side 124. The connector module 102 includes a contact array 130 of coaxial contacts 132 that are coupled to the connector body 120. The coaxial contacts 132 may extend from the front side 122 for mating with the coaxial contacts 324. The connector body 120 holds the coaxial contacts 132 at designated positions for engaging corresponding coaxial contacts 324. In particular embodiments, a pitch (or center-to-center spacing) between adjacent coaxial contacts 132 may be between 1.50 mm and 5.00 mm. In particular embodiments, the pitch may be between 2.00 mm and 3.50 mm or, more particularly, between 2.50 and 2.9. In other embodiments, however, the pitch may be greater or smaller.

The coaxial contacts 132 represent terminating ends of the corresponding coaxial cable assemblies 126. Each of the coaxial contacts 132 includes a center contact 134 and a conductive shell 136 that is coaxially aligned with the center contact 134. The center contacts 134 and conductive shells 136 may be electrically coupled to signal and ground paths (not shown) through the cables 128 of the coaxial cable assemblies 126. In alternative embodiments, the coaxial contacts 132 are not elements of coaxial cables and may be configured for termination to other components, such as a circuit board.

Figure 3:
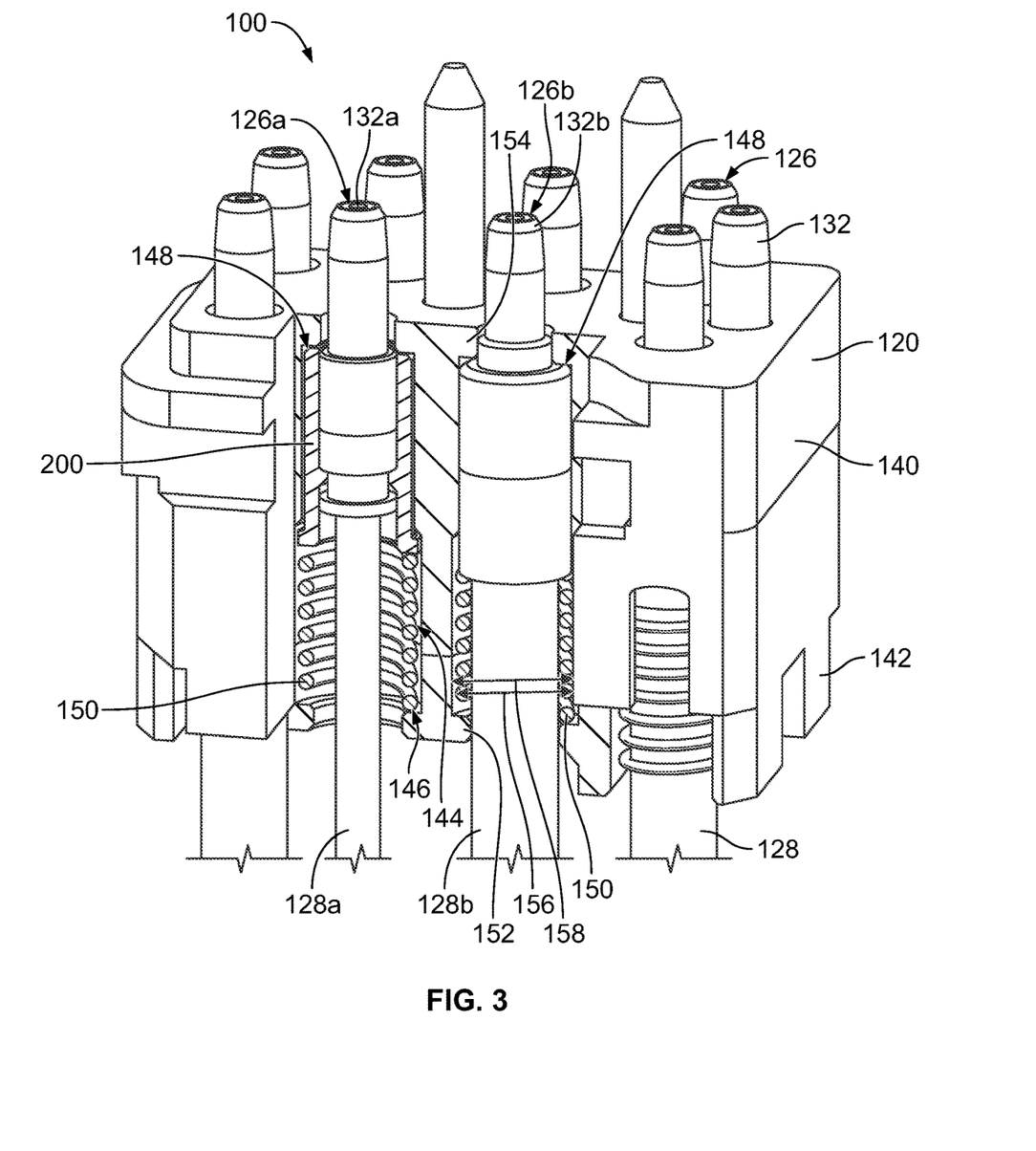
FIG. 3 is a partial sectional view of the connector assembly in accordance with an exemplary embodiment.

FIG. 3 is a partial sectional view of the connector assembly 100 in accordance with an exemplary embodiment. In an exemplary embodiment, the connector assembly 100 includes different types of coaxial cable assemblies 126 within the same connector body 120. For example, in the illustrated embodiment, the connector assembly 100 includes a first coaxial cable assembly 126a having first coaxial cables 128a and first coaxial contacts 132a and a second coaxial cable assembly 126b having second coaxial cables 128b and second coaxial contacts 132b. The first coaxial cables 128a are smaller than the second coaxial cables 128b (for example, have smaller diameters). The first coaxial contacts 132a are smaller than the second coaxial contacts 132b (for example, have smaller diameters). In an exemplary embodiment, the first coaxial contacts 132a utilize positioning adapters 200 to position the smaller first coaxial contacts 132a in the connector body 120. The positioning adapters 200 may make the first coaxial cable assemblies 126a have similar dimensions (for example, shape and size) as the second coaxial cable assemblies 126b.

In various embodiments, the connector body 120 is a multi-piece body. For example, the connector body 120 includes a forward section 140 and a rear section 142. The forward and rear sections 140, 142 are discrete elements that are configured to be secured to each other, which may be secured to each other using hardware (e.g., screws). The forward section 140 includes a plurality of contact cavities 144, and the rear section 142 includes a plurality of contact cavities 146. The contact cavities 144, 146 are aligned with each other to form contact channels 148. Each of the contact channels 148 is configured to receive a portion of a corresponding coaxial cable assembly 126, such as a corresponding coaxial contact 132.

In an exemplary embodiment, the connector assembly 100 includes biasing springs 150 associated with the cable assemblies 126. The biasing springs 150 surround the cables 128. The biasing springs 150 forward bias the cable assemblies 126 in the contact channels 148. The biasing springs 150 are held in the contact channels 148 by the rear section 142. For example, the biasing springs 150 may engage rear ledges or rear shoulders 152 of the rear section 142. The biasing springs 150 force the coaxial contacts 132 forward to engage front ledges or front shoulders 154 of the front section 140. In an exemplary embodiment, the biasing springs 150 have a spring diameter 156, which may be similar to (for example, slightly smaller than) a contact channel diameter 158. The exterior of the biasing springs 150 may engage the interior surfaces of the contact channels 148 to position the biasing springs 150 in the contact channels 148. The biasing springs 150 may directly engage the second coaxial contacts 132b of the second coaxial cable assemblies 126b and may engage the positioning adapters 200 of the first coaxial cable assemblies 126a.

Figure 4:
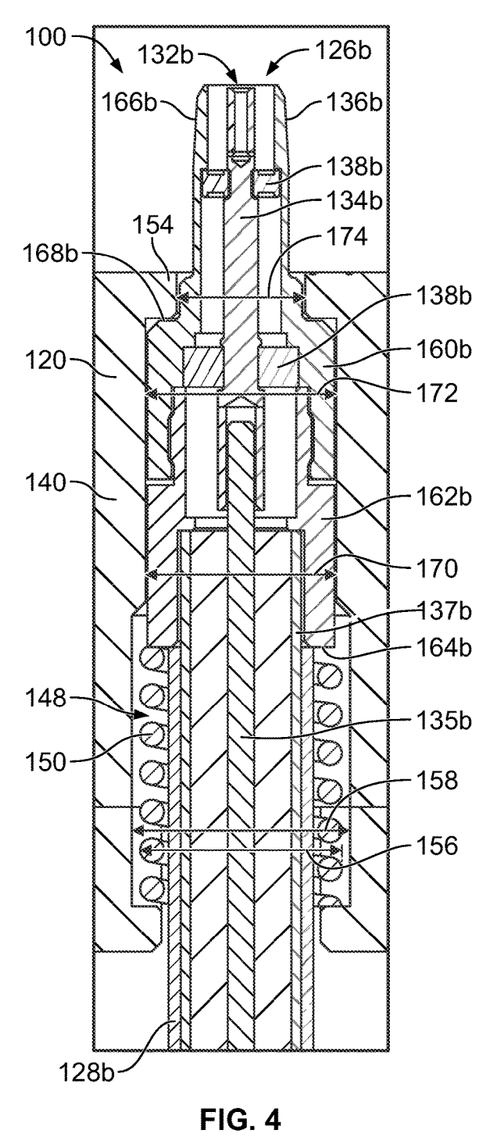
FIG. 4 is a cross-sectional view of a portion of the connector assembly showing the second coaxial cable assembly in accordance with an exemplary embodiment.

FIG. 4 is a cross-sectional view of a portion of the connector assembly 100 showing the second coaxial cable assembly 126b in accordance with an exemplary embodiment. The second coaxial contact 132b is terminated to the end of the second coaxial cable 128b. The coaxial cable 128b includes a center conductor 135b and a cable shield 137b. The center contact 134b is terminated to the center conductor 135b. The conductive shell 136b is terminated to the cable shield 137b. The insulator 138b is used to electrically isolate the center contact 134b from the conductive shell 136b.

In various embodiments, the conductive shell 136b is a multi-piece contact having a front contact 160b and a rear contact 162b. The front end of the rear contact 162b is press-fit into the front contact 160b. The biasing spring 150 engages a rear edge 164b of the rear contact 162b. A mating end 166b of the front contact 160b extends forward of the connector body 120. A shoulder 168b of the front contact 160b engages the front shoulder 154 of the forward section 140 of the connector body 120 to position the coaxial contact 132 relative to the connector body 120. The biasing spring 150 holds the coaxial contact 132b in the contact channel 148, such as forcing the shoulder 168b against the front shoulder 154. The coaxial contact 132b may be pressed rearward against the biasing spring 150 when mated with the connector assembly 300 (shown in FIG. 1).

In an exemplary embodiment, the conductive shell 136b has a shell diameter 170. The shell diameter 170 may be similar to the spring diameter 156 such that the biasing spring 150 presses against the rear edge 164b. The shell diameter 170 is similar to the contact channel diameter 158. For example, the conductive shell 136b may have a snug fit in the contact channel 148 to guide and position the center contact 134b in the contact channel 148 (for example, side-to-side). The conductive shell 136b is slidable within the contact channel 148. In an exemplary embodiment, the mating end 166b of the front contact 160b has a mating end diameter 172 smaller than the shell diameter 170. The mating end diameter 172 may be similar to a front opening diameter 174 at the front shoulder 154 of the forward section 140. The shell diameter 170 is larger than the front opening diameter 174 to ensure that the coaxial contact 132b is captured in the contact channel 148 by the front shoulder 154.

Figure 5:
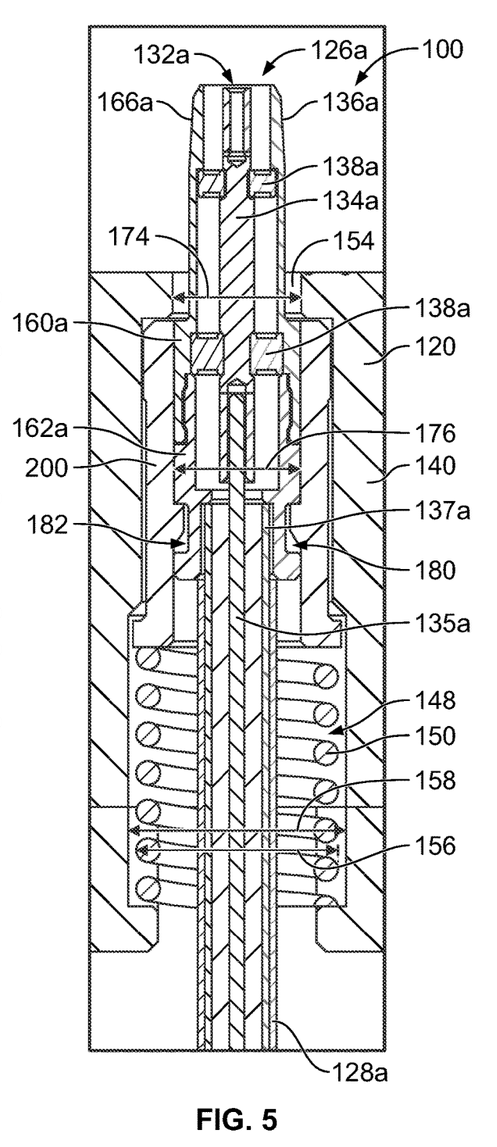
FIG. 5 is a cross-sectional view of a portion of the connector assembly showing the first coaxial cable assembly in accordance with an exemplary embodiment.

FIG. 5 is a cross-sectional view of a portion of the connector assembly 100 showing the first coaxial cable assembly 126a in accordance with an exemplary embodiment. The first coaxial cable assembly 126a uses the positioning adapter 200 to position the first coaxial contact 132a within the contact channel 148. The positioning adapter 200 is used to position the smaller sized first coaxial contact 132 and first coaxial cable 128a in the contact channel 148 designed to accept the larger diameter second coaxial cable assembly 126b. The first coaxial contact 132a is terminated to the end of the first coaxial cable 128a. The coaxial cable 128a includes a center conductor 135a and a cable shield 137b. The center conductor 135a may be a smaller diameter conductor compared to the center conductor 135b (shown in FIG. 4). The center contact 134a is terminated to the center conductor 135a. The conductive shell 136a is terminated to the cable shield 137a. The insulator 138a is used to electrically isolate the center contact 134a from the conductive shell 136a.

In various embodiments, the conductive shell 136a is a multi-piece contact having a front contact 160a and a rear contact 162a. The front end of the rear contact 162a is press-fit into the front contact 160a. The front contact 160a and the rear contact 162a are loaded into the positioning adapter 200. A mating end 166a of the front contact 160a extends forward of the positioning adapter 200 and the connector body 120. The biasing spring 150 engages the positioning adapter 200 to forward bias the first coaxial cable assembly 126a in the contact channel 148. The positioning adapter 200 engages the front shoulder 154 of the forward section 140 of the connector body 120 to position the coaxial contact 132 relative to the connector body 120. The coaxial contact 132a may be pressed rearward against the biasing spring 150 when mated with the connector assembly 300 (shown in FIG. 1).

In an exemplary embodiment, the conductive shell 136a has a shell diameter 176. The shell diameter 176 is less than the shell diameter 170 (shown in FIG. 4). In the illustrated embodiment, the shell diameter 176 is less than the front opening diameter 174 at the front shoulder 154 of the forward section 140. For example, the conductive shell 136a may fit through the front opening of the forward section 140. The positioning adapter 200 is oversized relative to the front opening and wider than the front opening diameter 174. The positioning adapter 200 engages the front shoulder 154 to capture and position the coaxial contact 132a in the contact channel 148.

The coaxial contact 132a includes a retention feature 180 to secure the positioning adapter 200 to the coaxial contact 132a. In the illustrated embodiment, the retention feature 180 includes a circumferential groove 182. Other types of retention features may be used in alternative embodiments. The positioning adapter 200 engages the retention feature 180 to hold an axial position of the positioning adapter 200 relative to the coaxial contact 132a. The positioning adapter 200 engages the retention feature 180 to position the coaxial contact 132a relative to the positioning adapter 200. The positioning adapter 200 engages the connector body 120 to position the coaxial contact 132a in the contact cavity 146 relative to the connector body 120.

Figure 6:
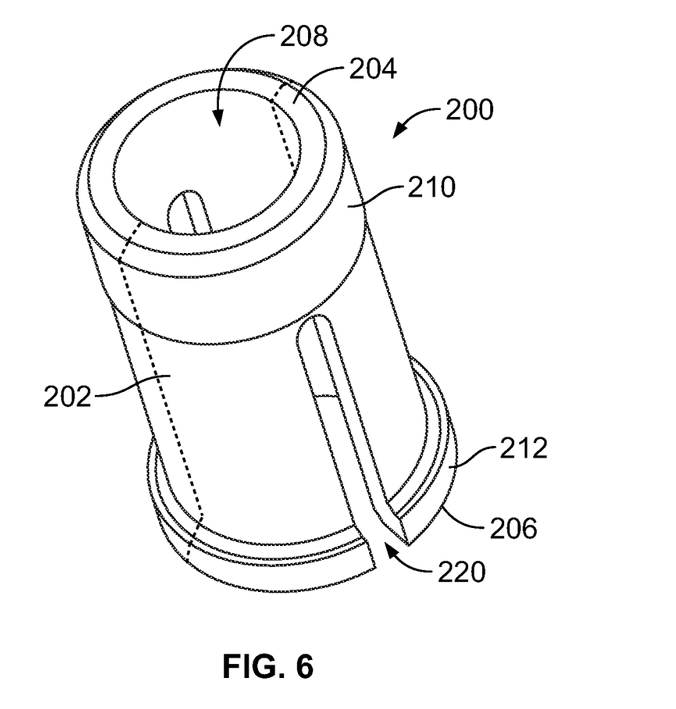
FIG. 6 is a front perspective view of the positioning adapter in accordance with an exemplary embodiment.
Figure 7:
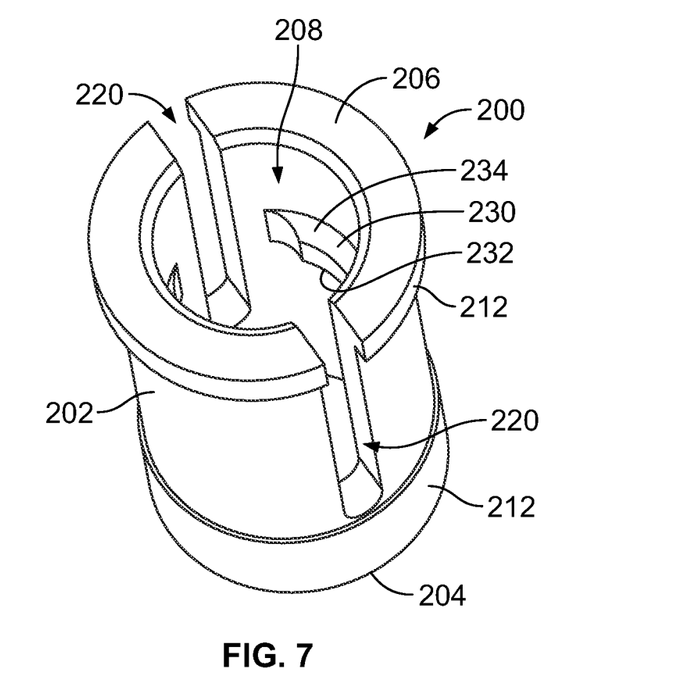
FIG. 7 is a front perspective view of the positioning adapter in accordance with an exemplary embodiment.

FIG. 6 is a front perspective view of the positioning adapter 200 in accordance with an exemplary embodiment. FIG. 7 is a front perspective view of the positioning adapter 200 in accordance with an exemplary embodiment. The positioning adapter 200 includes an adapter body 202 extending between a front 204 and a rear 206. The adapter body 202 includes an adapter bore 208 open at the front 204 and open at the rear 206. The adapter bore 208 is configured to receive the coaxial contact 132a (shown in FIG. 5). The adapter body 202 is configured to surround the coaxial contact 132a. In an exemplary embodiment, the adapter body 202 is manufactured from a plastic material. For example, the adapter body 202 may be a molded part, such as an injection molded part.

In an exemplary embodiment, the adapter body 202 has a circular cross-section. For example, the adapter body 202 may be generally cylindrical. The adapter body 202 includes a front lip 210 at the front 204 and a rear lip 212 at the rear 206. The front lip 210 and/or the rear lip 212 may be a flange. The adapter body 202 is stepped inward between the front lip 210 and the rear lip 212. The front lip 210 has a front lip diameter and the rear lip 212 has a rear lip diameter. The adapter body 202 has a first diameter between the front lip 210 and the rear lip 212 that is less than the front lip diameter and the rear lip diameter. The front lip 210 is used to position the positioning adapter 200 in the contact channel 148 (for example, position laterally, such as side-to-side). The rear lip 212 is used to position the positioning adapter 200 in the connector body 120 (for example, position axially, such as front-to-rear).

In an exemplary embodiment, the adapter body 202 includes a longitudinal slot 220 open at the rear 206 of the positioning adapter 200. The longitudinal slot 220 allows the adapter body 202 to flex outward when the coaxial contact 132a is loaded into the adapter bore 208. The adapter body 202 may be snapably coupled to the coaxial contact 132a when flexed at the longitudinal slot(s) 220. In the illustrated embodiment, two longitudinal slots 220 are provided. In alternative embodiments, the adapter body 202 may be a multi-piece body having a right half and a left half that are coupled together at a seam (shown in phantom).

In an exemplary embodiment, the positioning adapter 200 includes a cleat 230 extending into the adapter bore 208 from an interior surface of the adapter body 202. The cleat 230 is configured to engage the retention feature 180 of the coaxial contact 132a to secure the positioning adapter 200 to the coaxial contact 132a. For example, the cleat 230 is configured to be received in the circumferential groove 182. The cleat 230 holds an axial position of the adapter body 202 relative to the conductive shell 136a. The cleat 230 may be a rib or tab extending from the interior surface of the adapter body 202. In an exemplary embodiment, the cleat 230 includes a front facing seating surface 232 and a rear facing ramp surface 234. The ramp surface 234 guides loading of the conductive shell 136a into the adapter bore 208. The seating surface 232 is received in the circumferential groove 182 and engages the front wall of the circumferential groove 182 to hold the axial position of the adapter body 202 relative to the conductive shell 136a.

Figure 8:
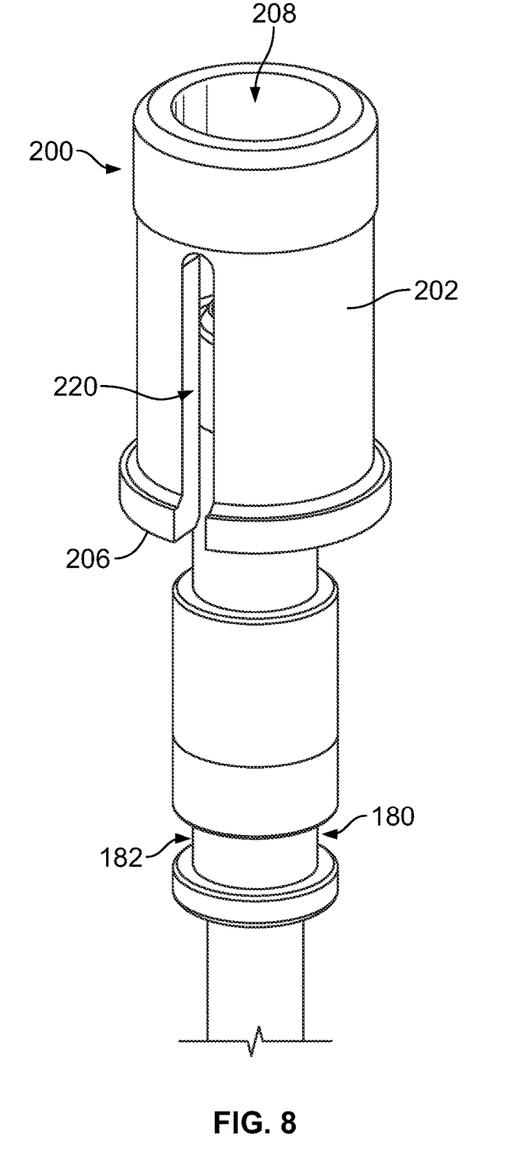
FIG. 8 is an exploded, front perspective view of the coaxial cable assembly in accordance with an exemplary embodiment.
Figure 9:
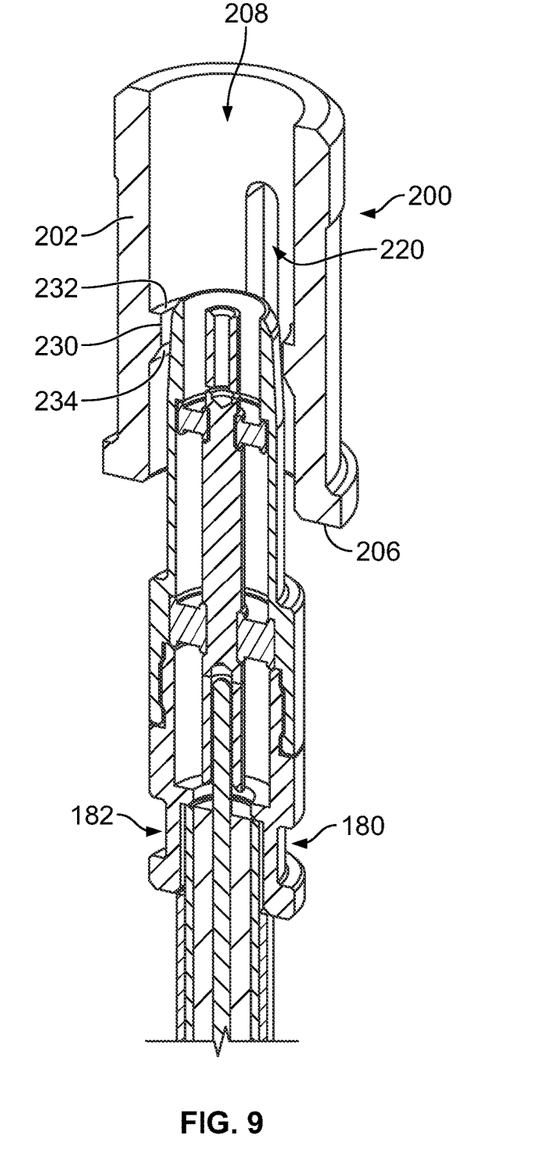
FIG. 9 is an exploded, partial sectional view of the coaxial cable assembly in accordance with an exemplary embodiment.

FIG. 8 is an exploded, front perspective view of the coaxial cable assembly 126a in accordance with an exemplary embodiment. FIG. 9 is an exploded, partial sectional view of the coaxial cable assembly 126a in accordance with an exemplary embodiment. During assembly, the coaxial contact 132a is loaded into the adapter bore 208. For example, the front end of the coaxial contact 132a may be loaded into the rear 206 of the adapter body 202.

The coaxial contact 132a is loaded into the adapter bore 208 to couple the cleat 230 to the retention feature 180. For example, the cleat 230 may be received in the circumferential groove 182. During loading, the ramp surface 234 engages the coaxial contact 132a to spread the rear of the adapter body 202 apart, such as at the longitudinal slots 220. When the cleats 230 clear the circumferential groove 182, the adapter body 202 snaps inward to load the cleats 230 into the circumferential groove 182. The seating surface 232 is configured to engage the forward lip or shoulder of the circumferential groove 182 to retain the cleats 230 in the circumferential groove 182. The cleats 230 hold the axial position of the positioning adapter 200 relative to the coaxial contact 132a.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. § 112(f), unless and until such claim limitations expressly use the phrase "means for" followed by a statement of function void of further structure.

What is claimed is:

1. A coaxial connector assembly comprising:
a connector module having a connector body that includes contact channels extending therethrough between a front side and a rear side of the connector body, the front side facing in a mating direction for mating with a mating connector assembly;
coaxial contacts received in the corresponding contact channels, the coaxial contacts being terminated to ends of coaxial cables, each coaxial contact having a center contact, a conductive shell coaxial with the center contact, and an insulator between the center contact and the conductive shell, the conductive shell having a retention feature; and
positioning adapters received in the corresponding contact channels, each positioning adapter including an adapter body forming an adapter bore extending between a front and a rear of the positioning adapter, the adapter bore receiving the corresponding coaxial contact such that the adapter body surrounds the coaxial contact, the rear of the adapter body is located rearward of the conductive shell, the adapter body engaging the retention feature to position the coaxial contact relative to the adapter body, the adapter body engaging the connector body to position the coaxial contact in the contact cavity relative to the connector body.

2. The coaxial connector assembly of claim 1, wherein the positioning adapter engages the retention feature to hold an axial position of the conductive shell relative to the adapter body.

3. The coaxial connector assembly of claim 1, wherein the retention feature includes a circumferential groove in an exterior of the conductive shell, the positioning adapter including a cleat received in the circumferential groove to hold an axial position of the conductive shell relative to the adapter body.

4. The coaxial connector assembly of claim 3, wherein the cleat includes a front facing seating surface received in the circumferential groove to hold the conductive shell relative to the adapter body and a rear facing ramp surface to guide loading of the conductive shell into the adapter bore.

5. The coaxial connector assembly of claim 1, wherein the adapter body is snapably coupled to the coaxial contact.

6. The coaxial connector assembly of claim 1, further comprising a spring positioned in the contact cavity rearward of the positioning adapter and the coaxial contact, the spring pressing against the positioning adapter to forward bias the positioning adapter.

7. The coaxial connector assembly of claim 6, wherein the spring has a spring diameter, the conductive shell having a shell diameter smaller than the spring diameter.

8. The coaxial connector assembly of claim 1, wherein the adapter body includes a longitudinal slot open at the rear of the positioning adapter to allow the adapter body to flex outward when the conductive shell is loaded into the adapter bore.

9. The coaxial connector assembly of claim 1, wherein the adapter body includes a front lip at the front and a rear lip at the rear, the adapter body having a first diameter between the front lip and the rear lip, the front lip having a front lip diameter greater than the first diameter, the rear lip having a rear lip diameter greater than the first diameter.

10. The coaxial connector assembly of claim 1, wherein the locating adapter positions the coaxial contact in a contact cavity having a pass-through diameter greater than a diameter of the conductive shell.

11. The coaxial connector assembly of claim 1, wherein the adapter body is a multi-piece body having a right half and a left half that are coupled together at a seam.

12. A coaxial connector assembly comprising:
a connector module having a connector body that includes first contact channels and second contact channels extending therethrough between a front side and a rear side of the connector body, the front side facing in a mating direction for mating with a mating connector assembly;
first coaxial contacts received in the corresponding first contact channels, the first coaxial contacts being terminated to ends of first coaxial cables, each first coaxial contact having a first center contact, a first conductive shell coaxial with the first center contact, and a first insulator between the first center contact and the first conductive shell, the first conductive shell having a retention feature;
second coaxial contacts received in the corresponding second contact channels, the second coaxial contacts being terminated to ends of second coaxial cables, each second coaxial contact having a second center contact, a second conductive shell coaxial with the second center contact, and a second insulator between the second center contact and the second conductive shell, the second conductive shell having different exterior dimensions than the first conductive shell; and
positioning adapters coupled to the corresponding first coaxial contacts, the positioning adapters being received in the corresponding first contact channels, each positioning adapter including an adapter body forming an adapter bore extending between a front and a rear of the positioning adapter, the adapter bore receiving the corresponding first coaxial contact such that the adapter body surrounds the first coaxial contact, the adapter body engaging the retention feature to position the first coaxial contact relative to the adapter body, the adapter body engaging the connector body to position the first coaxial contact in the first contact channel relative to the connector body;
wherein the first contact channels have equivalent dimensions as the second contact channels, the adapter bodies having substantially similar diameters as the second conductive shells to hold the first coaxial contacts in the first contact channels.

13. The coaxial connector assembly of claim 12, wherein the positioning adapter includes an adapter diameter, the second conductive shell including a shell diameter substantially similar to the adapter diameter.

14. The coaxial connector assembly of claim 12, wherein the positioning adapter and the first coaxial contact has an exterior shape substantially similar to an exterior shape of the second conductive shell.

15. The coaxial connector assembly of claim 12, wherein the first contact channels have front ports having front port diameters, the front port diameters being greater than first conductive shell diameters of the first conductive shells.

16. The coaxial connector assembly of claim 12, wherein the first coaxial cables have first cable diameters and the second coaxial cables have second cable diameters, the first cable diameters being approximately half the second cable diameters.

17. A coaxial contact assembly comprising:
a center contact having a mating end and a cable end, the cable end configured to be terminated to a conductor of a coaxial cable;
a conductive shell coaxial with the center contact, the conductive shell having a mating end and a cable end, the cable end configured to be terminated to a cable shield of the coaxial cable, the conductive shell including a shell bore receiving the center contact, the conductive shell having a retention feature;
an insulator received in the shell bore between the center contact and the conductive shell; and
a positioning adapter configured to be received in a contact cavity of a connector module, the positioning adapter including an adapter body forming an adapter bore extending between a front and a rear of the positioning adapter, the adapter body being manufactured from a dielectric material to electrically isolate the adapter body from the conductive shell, the adapter bore receiving the conductive shell such that the adapter body surrounds an exterior of the conductive shell, the adapter body engaging the retention feature to position the conductive shell relative to the adapter body and position the conductive shell in the contact cavity.

18. The coaxial contact assembly of claim 17, wherein the retention feature includes a circumferential groove in an exterior of the conductive shell, the positioning adapter including a cleat received in the circumferential groove to hold an axial position of the conductive shell relative to the adapter body.

19. The coaxial connector assembly of claim 18, wherein the cleat includes a front facing seating surface received in the circumferential groove to hold the conductive shell relative to the adapter body and a rear facing ramp surface to guide loading of the conductive shell into the adapter bore.

20. The coaxial contact assembly of claim 17, further comprising a spring coaxially surrounding the coaxial cable and engaging the rear of the adapter body, the spring forward biasing the positioning adapter in the contact cavity.

* * * * *